United States Patent
Rodder et al.

(10) Patent No.: US 9,257,327 B2
(45) Date of Patent: Feb. 9, 2016

(54) METHODS OF FORMING A FIELD EFFECT TRANSISTOR, INCLUDING FORMING A REGION PROVIDING ENHANCED OXIDATION

(71) Applicant: Samsung Electronics Co., Ltd., Suwon-si (KR)

(72) Inventors: Mark S. Rodder, University Park, TX (US); Kang-ill Seo, Loudonville, NY (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/859,482

(22) Filed: Apr. 9, 2013

(65) Prior Publication Data

US 2014/0302645 A1    Oct. 9, 2014

(51) Int. Cl.
*H01L 21/76* (2006.01)
*H01L 21/762* (2006.01)
*H01L 29/66* (2006.01)
*H01L 27/088* (2006.01)
*H01L 29/78* (2006.01)
*H01L 21/8238* (2006.01)
*H01L 21/8234* (2006.01)
*H01L 29/786* (2006.01)
*H01L 27/092* (2006.01)

(52) U.S. Cl.
CPC .. *H01L 21/76243* (2013.01); *H01L 21/823481* (2013.01); *H01L 21/823821* (2013.01); *H01L 21/823878* (2013.01); *H01L 27/0886* (2013.01); *H01L 27/0924* (2013.01); *H01L 29/66795* (2013.01); *H01L 29/66803* (2013.01); *H01L 29/785* (2013.01); *H01L 29/78609* (2013.01)

(58) Field of Classification Search
CPC ............ H01L 29/66795; H01L 29/785; H01L 21/823821; H01L 27/0924; H01L 29/66803; H01L 21/823878; H01L 27/0886; H01L 21/823481; H01L 29/78609
See application file for complete search history.

(56) References Cited

U.S. PATENT DOCUMENTS

| | | |
|---|---|---|
| 5,270,244 A | 12/1993 | Baliga |
| 5,318,915 A | 6/1994 | Baliga et al. |
| 5,322,802 A | 6/1994 | Baliga et al. |
| 5,338,945 A | 8/1994 | Baliga et al. |
| 5,399,883 A | 3/1995 | Baliga |
| 5,436,174 A | 7/1995 | Baliga et al. |
| 5,449,925 A | 9/1995 | Baliga et al. |
| 5,459,089 A | 10/1995 | Baliga |
| 5,543,637 A | 8/1996 | Baliga |
| 5,635,412 A | 6/1997 | Baliga |
| 5,681,762 A | 10/1997 | Baliga |
| 5,753,938 A | 5/1998 | Thapar et al. |
| 5,869,385 A | 2/1999 | Tang et al. |
| 5,950,076 A | 9/1999 | Baliga |
| 6,023,078 A | 2/2000 | Baliga |
| 6,075,259 A | 6/2000 | Baliga |
| 6,514,843 B2 | 2/2003 | Dokumaci et al. |
| 7,276,768 B2 * | 10/2007 | Furukawa et al. ............ 257/374 |
| 8,106,459 B2 * | 1/2012 | Chang ............ H01L 21/823412 257/328 |
| 8,263,462 B2 | 9/2012 | Hung et al. |
| 8,313,999 B2 * | 11/2012 | Cappellani et al. ........... 438/283 |
| 8,389,367 B2 * | 3/2013 | Zhou et al. .................... 438/283 |
| 8,409,948 B2 * | 4/2013 | Fischer et al. ................ 438/242 |

(Continued)

*Primary Examiner* — Bac Au
(74) *Attorney, Agent, or Firm* — Myers Bigel Sibley & Sajovec, PA

(57) ABSTRACT

Methods of forming a Field Effect Transistor (FET) are provided. The methods may include forming a region that provides enhanced oxidation under a fin-shaped FET (FinFET) body.

23 Claims, 15 Drawing Sheets

(56) References Cited

U.S. PATENT DOCUMENTS

| | | | |
|---|---|---|---|
| 8,420,464 B2* | 4/2013 | Basker et al. | 438/157 |
| 8,426,277 B2* | 4/2013 | Lin et al. | 438/283 |
| 8,460,984 B2* | 6/2013 | Wahl et al. | 438/164 |
| 8,673,704 B2* | 3/2014 | Zhu et al. | 438/164 |
| 8,896,067 B2* | 11/2014 | Bergendahl | H01L 21/823431 257/368 |
| 9,029,221 B2* | 5/2015 | Cappellani | H01L 29/66484 257/365 |
| 2006/0258072 A1* | 11/2006 | Kavalieros et al. | 438/197 |
| 2006/0292781 A1* | 12/2006 | Lee | H01L 21/28282 438/197 |
| 2008/0242037 A1* | 10/2008 | Sell et al. | 438/299 |
| 2010/0059821 A1 | 3/2010 | Rios et al. | |
| 2012/0083107 A1 | 4/2012 | Chang et al. | |
| 2013/0280883 A1* | 10/2013 | Faul | H01L 29/66803 438/434 |
| 2014/0001560 A1* | 1/2014 | Cappellani | H01L 27/1207 257/368 |

* cited by examiner

METHODS OF FORMING A FIELD EFFECT TRANSISTOR, INCLUDING FORMING A REGION PROVIDING ENHANCED OXIDATION

FIELD

The present disclosure generally relates to the field of semiconductor devices and, more particularly, to field effect transistors.

BACKGROUND

Performance characteristics of a semiconductor device may be impaired if a channel fin of the semiconductor device has a substantial downward dip at a bottom surface that is adjacent oxidation growth. For example, such a downward dip in a channel fin may result in a channel region that is imprecisely controlled by an adjacent gate electrode. As an example, the semiconductor device may experience short-channel effects and/or drain induced barrier lowering.

SUMMARY

Various embodiments of the present disclosure may provide methods of forming a Field Effect Transistor (FET). The methods may include implanting ions into a substrate that includes a fin-shaped FET (FinFET) body protruding from the substrate, such that the FinFET body overlaps a portion of an implanted region of the ions. The methods may include recessing the substrate to remove portions of the implanted region exposed by the FinFET body and such that the FinFET body overlaps a remaining portion of the implanted region. The methods may include forming an isolation layer on the substrate and on sidewalls of the remaining portion of the implanted region. Moreover, the methods may include oxidizing the remaining portion of the implanted region.

In various embodiments, the FinFET body may include a channel fin that includes a spacer thereon. Moreover, implanting the ions may include implanting the ions into the substrate that includes the channel fin including the spacer thereon.

According to various embodiments, implanting the ions may include implanting non-dopant ions at an angle of about zero. The non-dopant ions may include at least one of Argon, Silicon, Oxygen, Chlorine, Fluorine, and Germanium. Moreover, the substrate may be a bulk Silicon substrate.

In various embodiments, oxidizing the remaining portion of the implanted region may include oxidizing the remaining portion of the implanted region such that the remaining portion of the implanted region oxidizes under the FinFET body faster in a direction substantially parallel to a surface of the substrate than in an upward direction substantially perpendicular to the surface of the substrate.

According to various embodiments, implanting the ions may include implanting the ions to increase a lateral oxidation rate of the remaining portion of the implanted region relative to an oxidation rate in an upward vertical direction. Moreover, recessing the substrate may include recessing the substrate such that the remaining portion of the implanted region extends a greater distance in the direction substantially perpendicular to the surface of the substrate than in the direction substantially parallel to the surface of the substrate. Additionally or alternatively, implanting the ions may include implanting the ions to provide an implant straggle in the remaining portion of the implanted region that extends a predetermined distance of about half of a width of the FinFET body.

Methods of forming a Field Effect Transistor (FET), according to various embodiments, may include forming a material providing an enhanced oxidation rate and an adjacent fin-shaped FET (FinFET) body protruding from a substrate. Moreover, the methods may include oxidizing the material providing the enhanced oxidation rate such that the material providing the enhanced oxidation rate oxidizes under the FinFET body faster in a direction substantially parallel to a surface of the substrate than in an upward direction substantially perpendicular to the surface of the substrate.

In various embodiments, forming the material providing the enhanced oxidation rate may include implanting non-dopant ions at an angle of about zero into the substrate after forming the FinFET body. The substrate may be a bulk Silicon substrate. Moreover, the methods may include, before oxidizing the material providing the enhanced oxidation rate, recessing the substrate to remove portions of an implanted region of the non-dopant ions exposed by the FinFET body and such that the FinFET body overlaps a remaining portion of the implanted region, and forming an isolation layer on the substrate and on sidewalls of the remaining portion of the implanted region. It will be understood that the FinFET body may include a channel fin that includes a spacer thereon. Accordingly, implanting the non-dopant ions may include implanting the non-dopant ions into the substrate that includes the channel fin including the spacer thereon.

According to various embodiments, forming the material providing the enhanced oxidation rate may include implanting non-dopant ions into the substrate before forming the FinFET body. Moreover the methods may include annealing the substrate after implanting the non-dopant ions and before forming the FinFET body. Forming the FinFET body may include forming an epitaxial layer on the material providing the enhanced oxidation rate.

In various embodiments, forming the material providing the enhanced oxidation rate and the adjacent FinFET body may include forming first and second epitaxial layers, respectively, the second epitaxial layer overlapping the first epitaxial layer. Moreover, a lateral oxidation rate of the material providing the enhanced oxidation rate may be faster than an oxidation rate of the material in an upward vertical direction. The second epitaxial layer may form a channel fin of the FinFET body. The first epitaxial layer may include the material providing the enhanced oxidation rate, and may provide an oxidation rate that is faster than an oxidation rate provided by the second epitaxial layer.

In various embodiments, forming the material providing the enhanced oxidation rate may include forming the material providing the enhanced oxidation rate to provide an implant straggle that extends under the FinFET body a predetermined distance of about half of a width of the FinFET body.

Methods of forming a Field Effect Transistor (FET), according to various embodiments, may include forming a region that provides increased lateral oxidation relative to oxidation of the region in an upward vertical direction under a fin-shaped FET (FinFET) body. Moreover, forming the region that provides increased lateral oxidation may include implanting ions into a substrate from which the FinFET body protrudes.

Other methods according to embodiments of the present disclosure will be or become apparent to one with skill in the art upon review of the following drawings and detailed description. It is intended that all such additional methods be included within this description, be within the scope of the present inventive concepts, and be protected by the accompanying claims. Moreover, it is intended that all embodiments disclosed herein can be implemented separately or combined in any way and/or combination.

DETAILED DESCRIPTION

Figure 1A:
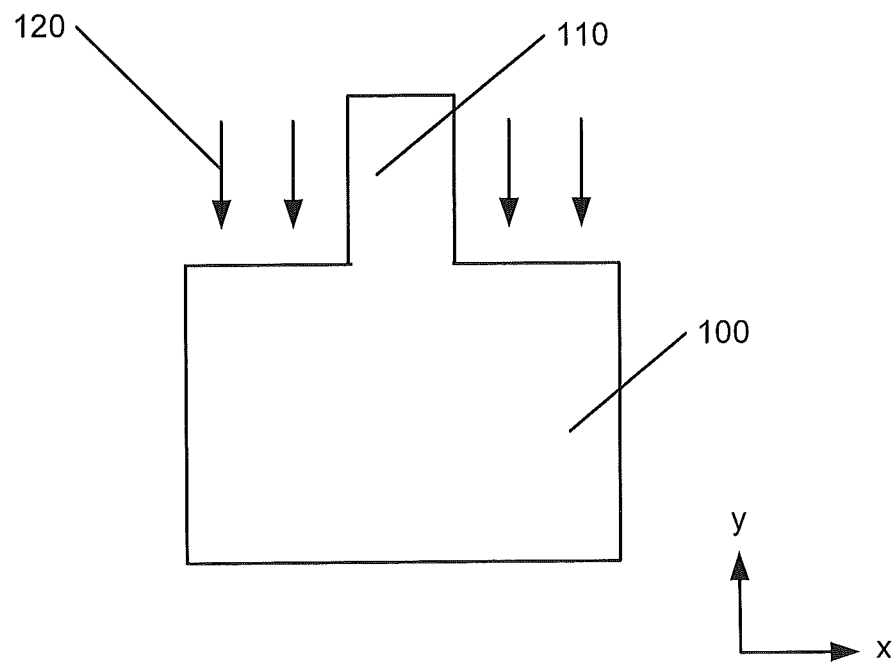
FIGS. 1A-1E and 2 are cross-sectional views illustrating intermediate structures provided in operations of forming a field effect transistor, according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the present inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the present inventive concepts should not be construed as limited to the particular shapes illustrated herein but may include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concepts.

As appreciated by the present inventive entity, a conventionally-formed semiconductor device channel fin may have a relatively large downward dip at a bottom surface that is adjacent oxidation growth, and such a downward dip may cause short-channel effects and/or other undesirable performance characteristics in the semiconductor device. For example, circular oxidation growth fronts adjacent the bottom surface of the channel fin may reduce the smoothness (e.g., uniformity) of an interface of the channel fin with the adjacent oxidation growth. Such circular oxidation growth fronts may result from lateral and vertical oxidation rates that are the same. Various embodiments of the present inventive concepts, however, provide operations of forming a field effect transistor, where the operations may include forming a region that provides increased lateral oxidation relative to oxidation of the region in an upward vertical direction under a channel fin. Accordingly, the field effect transistor may be formed to have a relatively smooth oxide surface under the channel fin. In some embodiments, the term "enhanced oxidation," as used herein, may refer to a material/region that provides a lateral oxidation rate that is faster than an upward vertical oxidation rate of the material/region.

FIGS. 1A-1E and 2 are cross-sectional views illustrating intermediate structures provided in operations of forming a field effect transistor, according to various embodiments of the present inventive concepts. Referring now to FIG. 1A, operations of forming a Field Effect Transistor (FET) may include implanting ions 120 into a substrate 100 that includes a fin-shaped FET (FinFET) body (e.g., a channel fin) 110 protruding from the substrate 100. In particular, the ions 120 may be implanted such that the FinFET body 110 overlaps a portion of an implanted region 130A/130B of the ions 120

Figure 1B:
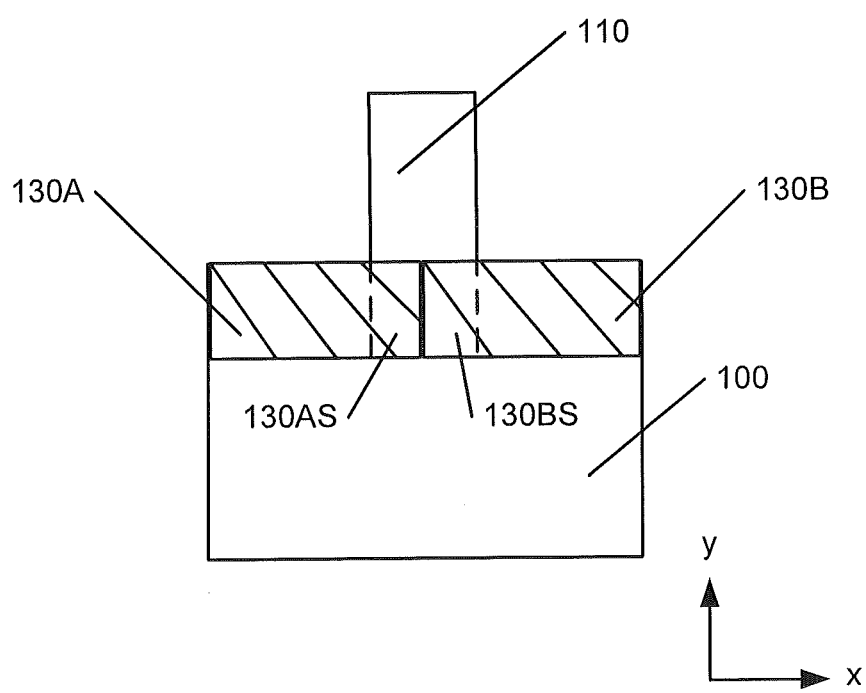

(FIG. 1B). For example, as illustrated in FIG. 1B, the implanted region 130A/130B may include respective straggle regions 130AS and 130BS that each extend (e.g., starting at or near the dashed vertical lines in FIG. 1B) under the channel fin to about a center of the width (in the x-direction) of the channel fin.

It will be understood that the ions 120 may be non-dopant (e.g., electrically inactive) ions. As an example, the ions 120 may include at least one of Argon, Silicon, Oxygen, Chlorine, Fluorine, and Germanium. Other examples of the ions 120 include Helium, Boron, and Phosphorus. Additionally or alternatively, it will be understood that the substrate 100 may be a bulk Silicon substrate. The FinFET body 110 may also include Silicon and/or may include a different material from the substrate 100. Accordingly, it will be understood that the FinFET body 110 may include Silicon or may not include Silicon.

Figure 1C:
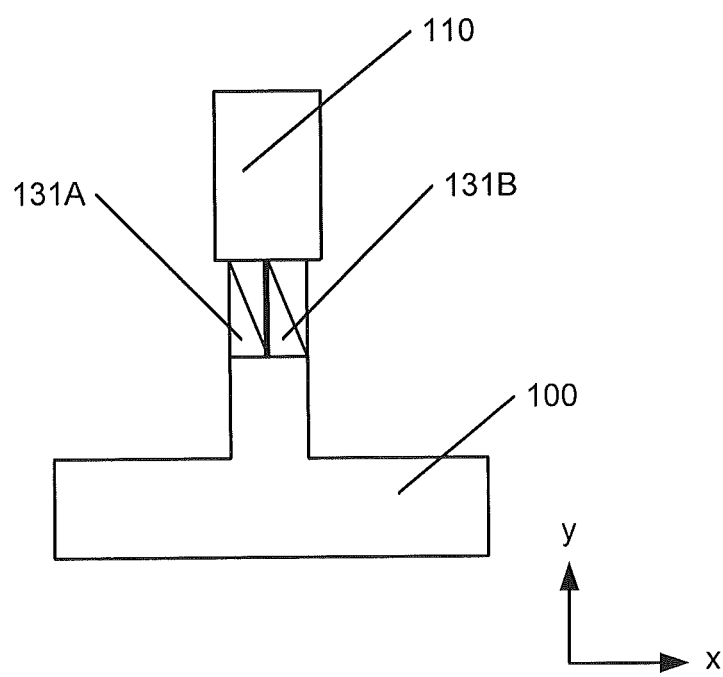

Referring now to FIG. 1C, the substrate 100 may be recessed to remove portions of the implanted region 130A/130B that were exposed by the FinFET body 110, and such that the FinFET body 110 overlaps a remaining portion 131A/131B of the implanted region 130A/130B, The remaining portion 131A/131B of the implanted region 130A/130B may have a shape that is longer/deeper than it is wide. For example, the substrate 100 may be recessed such that the remaining portion 131A/131B of the implanted region 130A/130B extends a greater distance (e.g., about thirty (30.0) percent more) in the direction substantially perpendicular to the surface of the substrate 100 (e.g., the y-direction) than in the direction substantially parallel to the surface of the substrate 100 (e.g., the x-direction). Moreover, the remaining portion 131A/131B of the implanted region 130A/130B may include respective portions of the straggle regions 130AS and 130BS, one or both of which may extend a predetermined distance (e.g., a distance determined before implanting the ions 120) of about half (or at least forty (40.0) percent) of a width (in the x-direction) of the FinFET body 110.

Figure 1D:
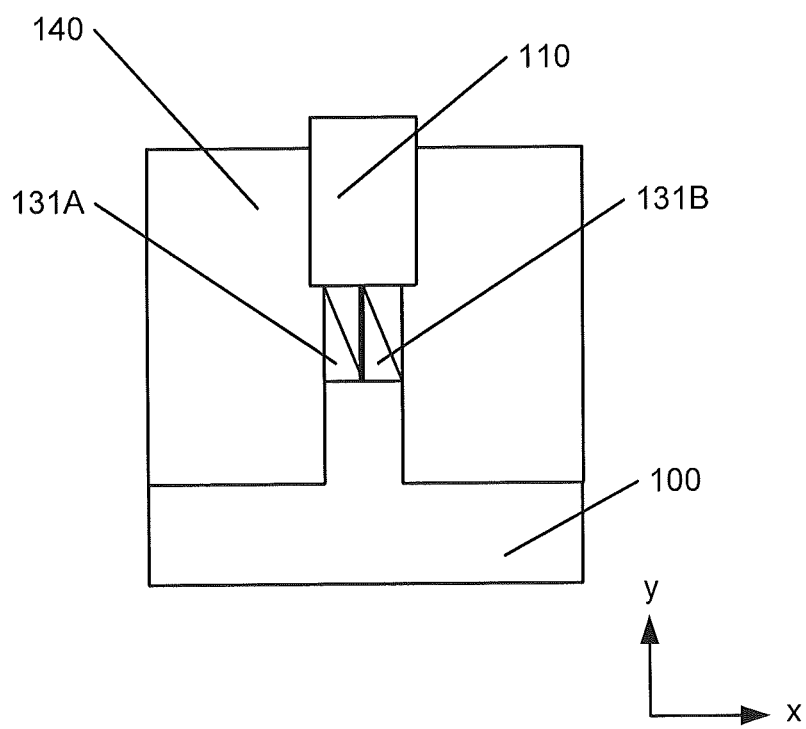

Referring now to FIG. 1D, the operations may include forming an isolation layer 140 on the substrate 100 and on sidewalls of the remaining portion 131A/131B of the implanted region 130A/130B. The isolation layer 140 may be a shallow trench isolation layer, among other isolation layers. The operations may also include oxidizing the remaining portion 131A/131B of the implanted region 130A/130B (FIG. 1E).

Figure 1E:
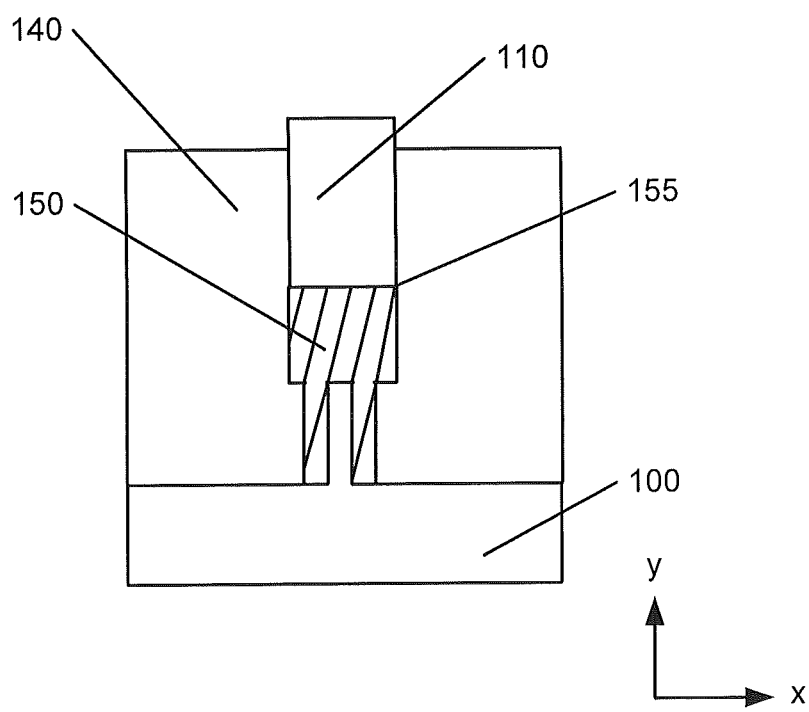

As illustrated in FIG. 1E, an oxidized region 150 resulting from oxidizing the remaining portion 131A/131B of the implanted region 130A/130B may have an interface 155 with the overlying FinFET body 110 (e.g., an overlying channel fin). In particular, a surface of the FinFET body 110 may have a relatively smooth interface 155 with the underlying/undercutting oxidized region 150 because the implanted region 130A/130B may oxidize under the FinFET body 110 faster laterally in the x-direction than upward vertically in the y-direction. For example, non-circular oxidation growth fronts may be provided adjacent the surface of the FinFET body 110. The relatively smooth interface 155 may provide improved semiconductor device performance (e.g., via reduced short-channel effects and/or an improved ratio of on current to off current) in comparison with a relatively large downward dip of a FinFET body at an interface with an oxidized region. Moreover, FIG. 1E illustrates that the oxidized region 150 may include portions that extend under the remaining portion 131A/131B of the implanted region 130A/130B, whereas other regions under the remaining portion 131A/131B of the implanted region 130A/130B may be unoxidized after the oxidation operation.

Figure 2:
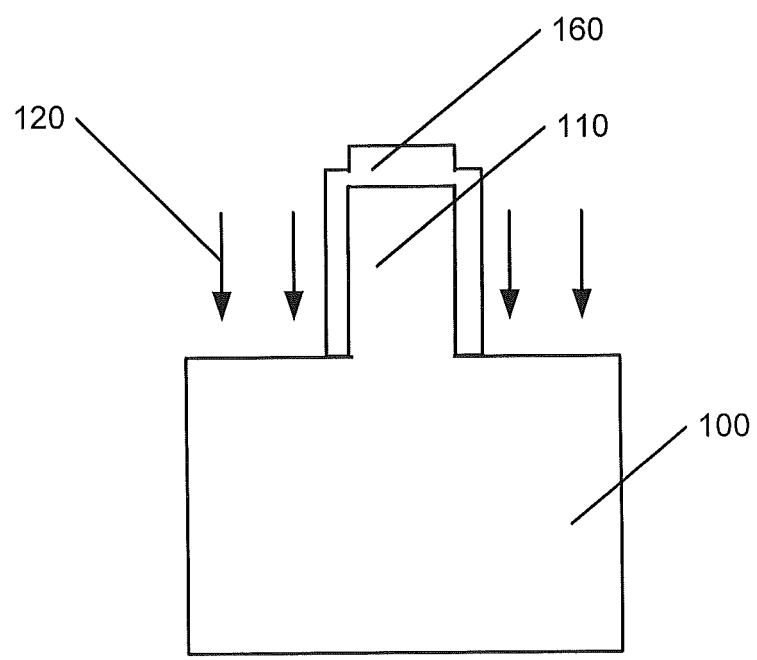

Referring now to FIG. 2, it will be understood that the FinFET body 110 may be a channel fin having a spacer (or group of spacers) 160 thereon. Accordingly, the implantation operation illustrated in FIG. 1A may include implanting the ions 120 into the substrate 100 that has the channel fin having the spacer 160 thereon. Moreover, it will be understood that all of the operations illustrated in FIGS. 1A-1E may be performed with the spacer 160 on the channel fin. For example, portions of the implanted region 130A/130B illustrated in FIG. 1B may undercut the channel fin that is protected by the spacer 160. The spacer 160 may include a nitride material and/or other spacer materials.

Figure 3A:
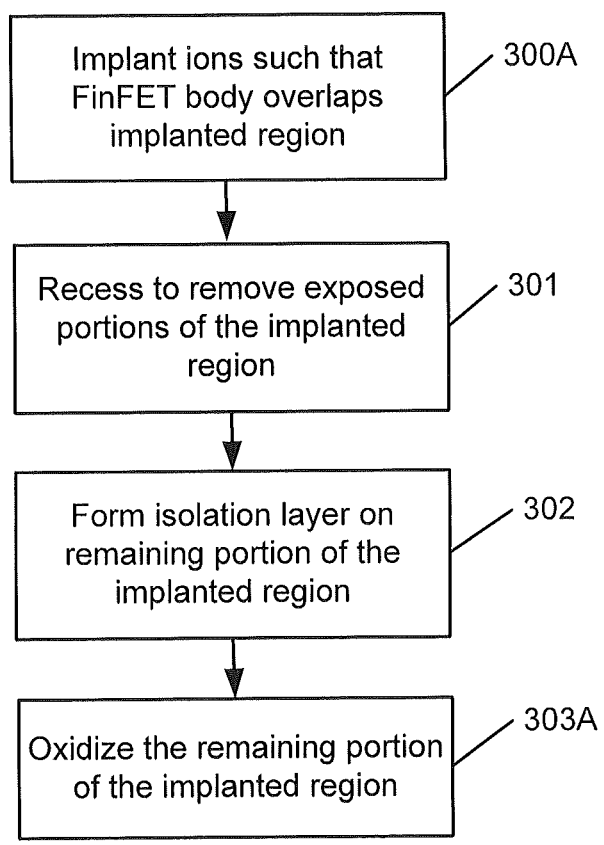
FIGS. 3A-3D and 4A-4E are flowcharts illustrating operations of forming a field effect transistor, according to various embodiments of the present inventive concepts.

FIGS. 3A-3D and 4A-4E are flowcharts illustrating operations of forming a field effect transistor, according to various embodiments of the present inventive concepts. Referring now to FIG. 3A, the operations may include implanting ions 120 into a substrate 100 that includes a FinFET body (e.g., a channel fin) 110 protruding from the substrate 100, such that the FinFET body 110 overlaps a portion of an implanted region 130A/130B of the ions 120 (Block 300A). The substrate 100 may be recessed to remove portions of the implanted region 130A/130B that were exposed by the FinFET body 110, and such that the FinFET body 110 overlaps a remaining portion 131A/131B of the implanted region 130A/130B (Block 301). Moreover, an isolation layer 140 may be formed on the substrate 100 and on sidewalls of the remaining portion 131A/131B of the implanted region 130A/130B (Block 302). The remaining portion 131A/131B of the implanted region 130A/130B may then be oxidized (Block 303A). Accordingly, it will be understood that Blocks 300A-303A of FIG. 3A may include operations that are also illustrated in the cross-sectional views of FIGS. 1A-1E.

Figure 3B:
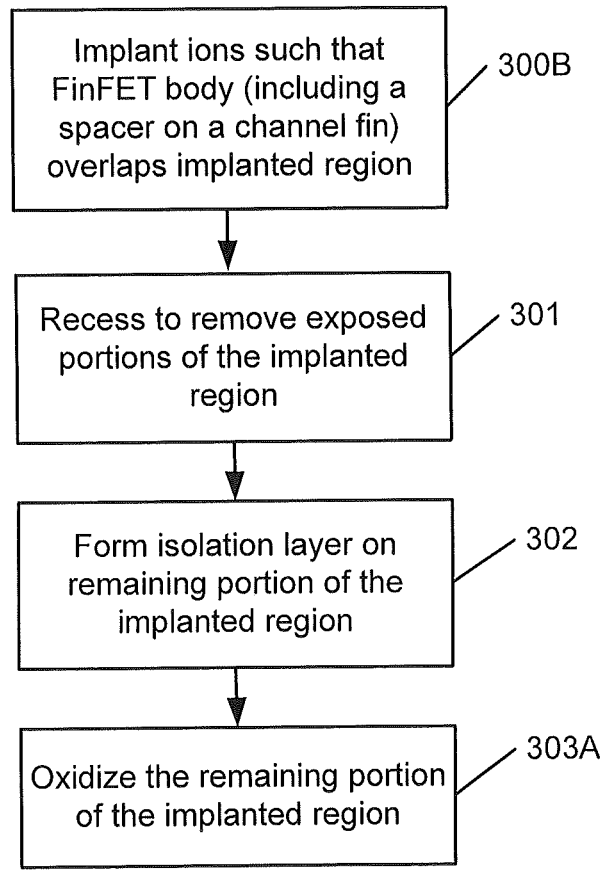

Referring now to FIG. 3B, the implantation operation illustrated in Block 300A of FIG. 3A may include implanting the ions 120 into a substrate 100 that has a channel fin having a spacer 160 thereon (Block 300B). Accordingly, the operation(s) of Block 300B may also be illustrated in the cross-sectional view of FIG. 2. Moreover, it will be understood that all of the operations illustrated in Blocks 300A-303A may be performed with the spacer 160 on the channel fin.

Figure 3C:
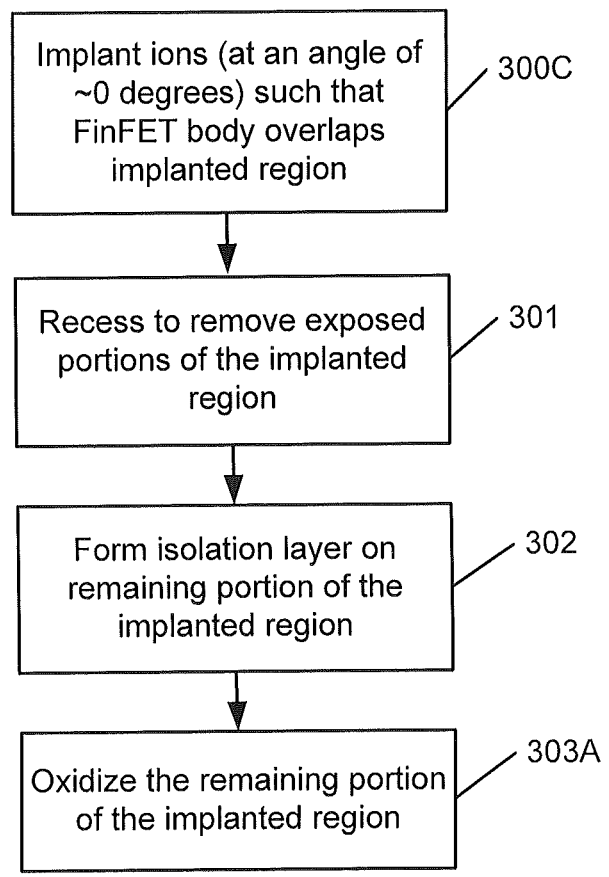

Referring now to FIG. 3C, the implantation operation illustrated in Block 300A of FIG. 3A may include implanting the ions 120 into the substrate 100 at an angle of about (e.g., substantially) zero (0) degrees (Block 300C). For example, referring again to FIG. 1A, the arrows illustrate that the ions 120 may be implanted at an angle of about zero (0) degrees with respect to the y-axis.

Figure 3D:
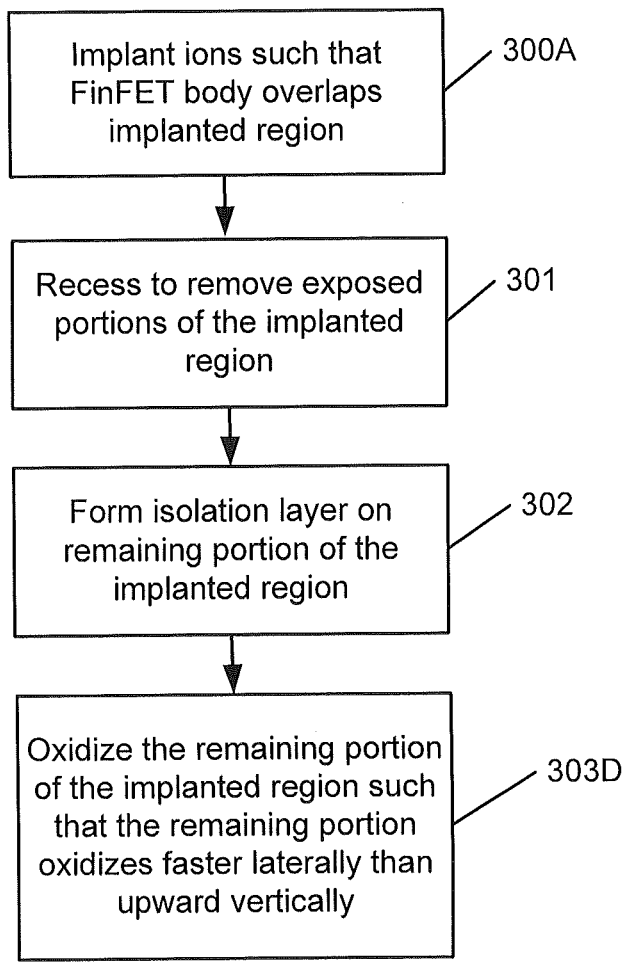

Referring now to FIG. 3D, it will be understood that the oxidation operation illustrated in Block 303A of FIG. 3A may include oxidizing the remaining portion 131A/131B of the implanted region 130A/130B such that the remaining portion 131A/131B of the implanted region 130A/130B oxidizes under the FinFET body 110 faster in a direction substantially parallel to a surface of the substrate 100 than in an upward direction substantially perpendicular to the surface of the substrate (Block 303D). For example, referring again to FIG. 1E, the remaining portion 131A/131B of the implanted region 130A/130B may oxidize under the FinFET body 110 faster laterally in the x-direction than upward vertically in the y-direction. Accordingly, it will be understood that the ions 120 may be implanted to increase a lateral oxidation rate of the remaining portion 131A/131B of the implanted region 130A/130B relative to an oxidation rate in an upward vertical direction.

Figure 4A:
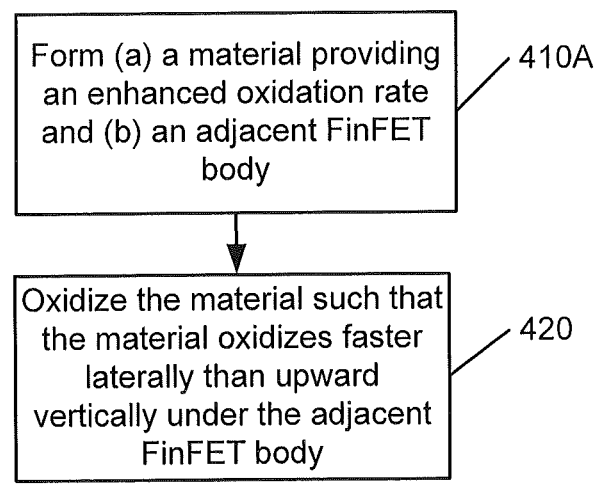

Referring now to FIG. 4A, operations of forming a field effect transistor may include forming (a) a material providing an enhanced oxidation rate and (b) an adjacent FinFET body 110 protruding from a substrate 100 (Block 410A). The operations may also include oxidizing the material providing the enhanced oxidation rate such that the material providing the enhanced oxidation rate oxidizes under the FinFET body 110 faster in a direction substantially parallel to a surface of the substrate 100 (e.g., laterally) than in an upward direction substantially perpendicular to the surface of the substrate 100 (e.g., vertically) (Block 420). Moreover, it will be understood that a spacer 160 may be on the FinFET body 110, as illustrated in FIG. 2. Additionally or alternatively, the material providing the enhanced oxidation rate may be formed to provide an implant straggle 130AS and/or 130BS that extends under the FinFET body 110 a predetermined distance (e.g., a distance determined before forming the material) that is about half of a width (in the x-direction) of the FinFET body 110, as illustrated in FIG. 1B.

Figure 4B:
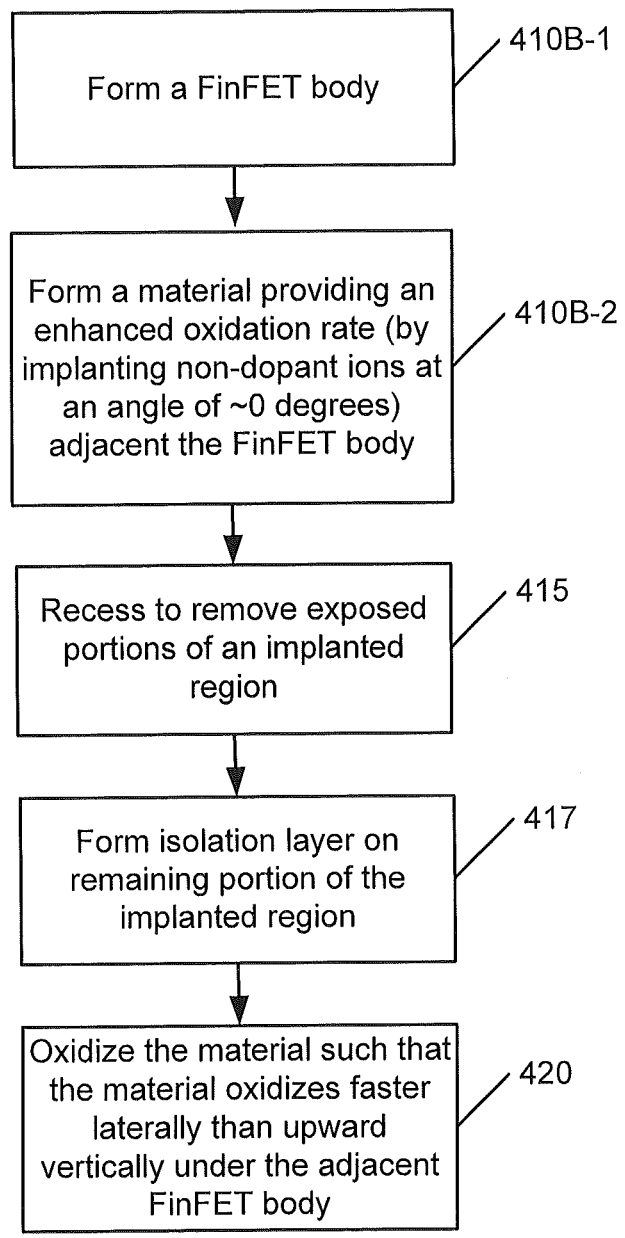

Referring now to FIG. 4B, the operation in Block 410A of FIG. 4A of forming the material providing the enhanced oxidation rate may include forming a FinFET body (Block 410B-1) and then implanting non-dopant ions 120 at an angle of about zero (0) into the substrate 100 adjacent the FinFET body 110 (Block 410B-2). For example, the non-dopant ions 120 may be implanted using sufficient energy such that implant straggle 130AS and/or 130BS extends under the FinFET body 110 a predetermined distance that is about half of a width of the FinFET body 110. Moreover, the substrate 100 may be a bulk Silicon substrate. Before oxidizing the material providing the enhanced oxidation rate in Block 420, the operations may include recessing the substrate 100 to remove portions of an implanted region 130A/130B of the non-dopant ions that is exposed by the FinFET body 110 and such that the FinFET body 110 overlaps a remaining portion 131A/131B of the implanted region 130A/130B (Block 415). The operations may also include forming an isolation layer 140 on the substrate 100 and on sidewalls of the remaining portion 131A/131B of the implanted region 130A/130B, before oxidizing the material providing the enhanced oxidation rate in Block 420 (Block 417). Accordingly, it will be understood that Blocks 410B-1 through 420 of FIG. 4B may include operations that are also illustrated in the cross-sectional views of FIGS. 1A-1E. Moreover, it will be understood that any method/technique may be used to provide an enhanced oxidation rate under the FinFET body 110.

Figure 4C:
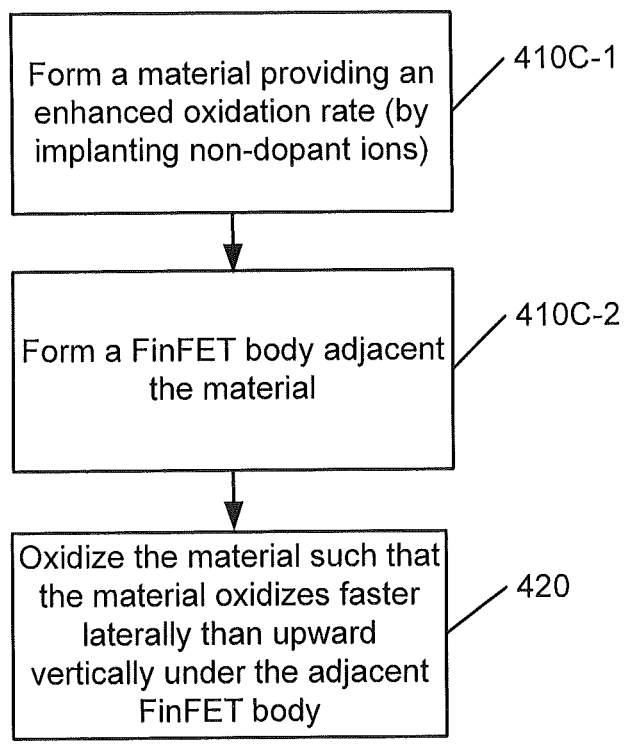
Figure 4D:
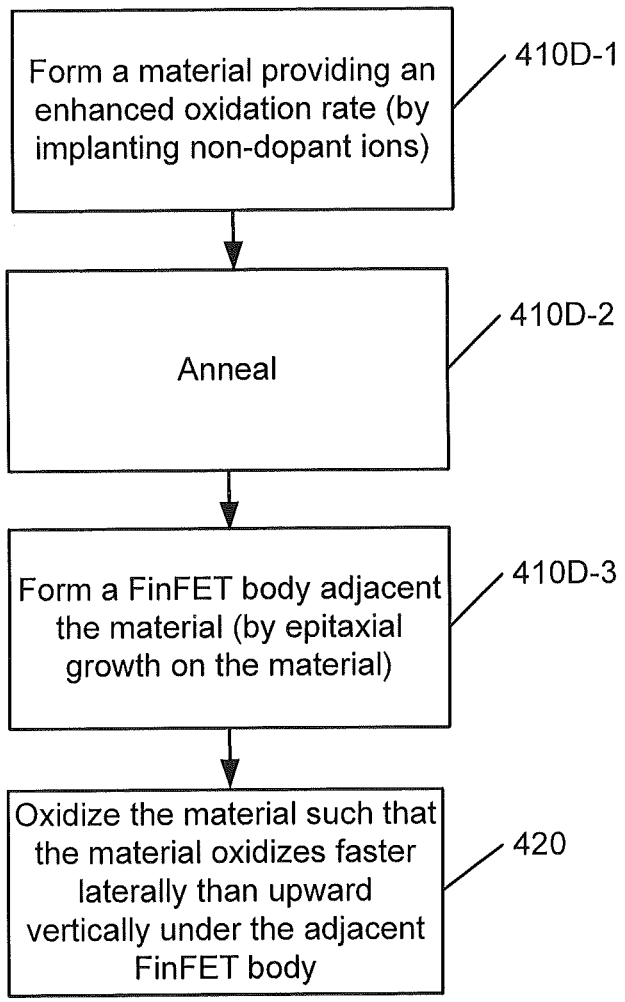

Referring now to FIG. 4C, the operation in Block 410A of FIG. 4A of forming the material providing the enhanced oxidation rate may include implanting non-dopant ions into the substrate 100 (Block 410C-1) before forming the FinFET body 110 adjacent the material providing the enhanced oxidation rate (Block 410C-2). Moreover, referring now FIG. 4D, the substrate 100 may be annealed (Block 410D-2) after implanting the non-dopant ions (Block 410D-1) and before forming the FinFET body 110 (Block 410D-3). Also, forming the FinFET body 110 may include forming an epitaxial layer on the material providing the enhanced oxidation rate.

Figure 4E:
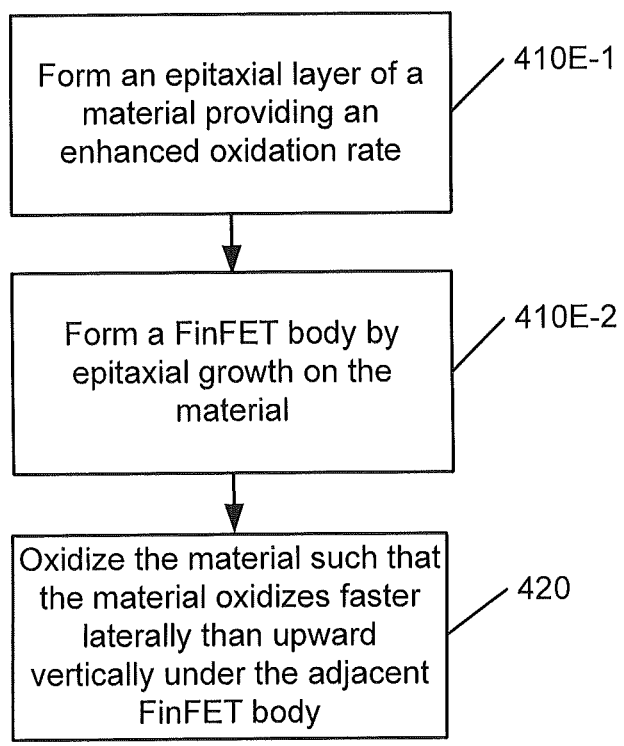

Referring now to FIG. 4E, the operation in Block 410A of FIG. 4A of forming the material providing the enhanced oxidation rate may include forming first (Block 410E-1) and second (Block 410E-2) epitaxial layers, respectively, the second epitaxial layer overlapping the first epitaxial layer. The second epitaxial layer may form a channel fin of the FinFET body 110, and the first epitaxial layer may include the material providing the enhanced oxidation rate. Moreover, it will be understood that a lateral oxidation rate of the material providing the enhanced oxidation rate may be faster than an oxidation rate of the material in an upward vertical direction. Also, the first epitaxial layer (including the material) may provide a lateral oxidation rate that is faster than a lateral oxidation rate provided by the second epitaxial layer.

Accordingly, various embodiments illustrated in FIGS. 1A-4E may provide operations of forming a FET. The operations may include forming a region (e.g., a material/layer) that provides increased lateral oxidation relative to oxidation of the region in an upward vertical direction under a FinFET body 110. For example, forming the region that provides increased lateral oxidation may include implanting ions 120 into a substrate 100 from which the FinFET body 110 protrudes. By forming the region to provide increased lateral oxidation relative to upward vertical oxidation, the FET may be formed to have a relatively smooth oxide surface under the FinFET body 110 (e.g., under an unoxidized channel fin), which may reduce short-channel effects and/or other undesirable performance characteristics in the FET.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed various embodiments and, although specific terms are employed, they are used in a generic and descriptive sense only and not for purposes of limitation.

What is claimed is:

1. A method of forming a Field Effect Transistor (FET), comprising:

implanting ions into a substrate comprising a fin-shaped FET (FinFET) body protruding from the substrate, such that the FinFET body overlaps a portion of an implanted region of the ions, wherein the FinFET body comprises opposite first and second sidewalls;

recessing the substrate to remove portions of the implanted region exposed by the FinFET body and such that the FinFET body overlaps a remaining portion of the implanted region;

forming an isolation layer on the substrate and on sidewalls of the remaining portion of the implanted region; and oxidizing the remaining portion of the implanted region to provide an oxidized region that laterally extends under the FinFET body a distance that comprises at least a majority of a width of the FinFET body, wherein the width comprises a distance from the first sidewall to the opposite second sidewall of the FinFET body.

2. The method of claim 1, wherein:

the FinFET body comprises a channel fin comprising a spacer thereon; and implanting the ions comprises implanting the ions into the substrate comprising the channel fin comprising the spacer thereon.

3. The method of claim 1, wherein:

implanting the ions comprises implanting non-dopant ions at an angle of about zero; and the substrate comprises a bulk Silicon substrate.

4. The method of claim 3, wherein the non-dopant ions comprise at least one of Argon, Silicon, Oxygen, Chlorine, Fluorine, and Germanium.

5. The method of claim 1, wherein oxidizing the remaining portion of the implanted region comprises oxidizing the remaining portion of the implanted region such that the remaining portion of the implanted region oxidizes under the FinFET body faster in a direction substantially parallel to a surface of the substrate than in an upward direction substantially perpendicular to the surface of the substrate.

6. The method of claim 1, wherein implanting the ions comprises implanting the ions to increase a lateral oxidation rate of the remaining portion of the implanted region relative to an oxidation rate in an upward vertical direction.

7. The method of claim 6, wherein implanting the ions comprises implanting the ions to provide an implant straggle in the remaining portion of the implanted region that extends a predetermined distance comprising about half of the width of the FinFET body.

8. The method of claim 6, wherein recessing the substrate comprises recessing the substrate such that the remaining portion of the implanted region extends a greater distance in the upward vertical direction substantially perpendicular to a surface of the substrate than in a direction substantially parallel to the surface of the substrate.

9. A method of forming a Field Effect Transistor (FET), comprising:
implanting ions into a substrate comprising a fin-shaped FET (FinFET) body protruding from the substrate, such that the FinFET body overlaps a portion of an implanted region of the ions;
recessing the substrate to remove portions of the implanted region exposed by the FinFET body and such that the FinFET body overlaps a remaining portion of the implanted region;
forming an isolation layer on the substrate and on sidewalls of the remaining portion of the implanted region; and
oxidizing the remaining portion of the implanted region,
wherein implanting the ions comprises implanting the ions to increase a lateral oxidation rate of the remaining portion of the implanted region relative to an oxidation rate in an upward vertical direction, and
wherein recessing the substrate comprises recessing the substrate such that the remaining portion of the implanted region extends a greater distance in the upward vertical direction substantially perpendicular to a surface of the substrate than in a direction substantially parallel to the surface of the substrate.

10. A method of forming a Field Effect Transistor (FET), comprising:
forming a material providing an enhanced oxidation rate and an adjacent fin-shaped FET (FinFET) body protruding from a substrate, wherein the FinFET body comprises opposite first and second sidewalls; and
oxidizing the material providing the enhanced oxidation rate such that the material providing the enhanced oxidation rate oxidizes under the FinFET body faster in a direction substantially parallel to a surface of the substrate than in an upward direction substantially perpendicular to the surface of the substrate, to provide an oxidized region that laterally extends under the FinFET body a distance that comprises at least a majority of a width of the FinFET body, wherein the width comprises a distance from the first sidewall to the opposite second sidewall of the FinFET body.

11. The method of claim 10, wherein:
forming the material providing the enhanced oxidation rate comprises implanting non-dopant ions at an angle of about zero into the substrate after forming the FinFET body; and
the substrate comprises a bulk Silicon substrate.

12. The method of claim 11, further comprising, before oxidizing the material providing the enhanced oxidation rate:
recessing the substrate to remove portions of an implanted region of the non-dopant ions exposed by the FinFET body and such that the FinFET body overlaps a remaining portion of the implanted region; and
forming an isolation layer on the substrate and on sidewalls of the remaining portion of the implanted region.

13. The method of claim 12, wherein:
the FinFET body comprises a channel fin comprising a spacer thereon; and
implanting the non-dopant ions comprises implanting the non-dopant ions into the substrate comprising the channel fin comprising the spacer thereon.

14. The method of claim 10, wherein forming the material providing the enhanced oxidation rate comprises forming the material providing the enhanced oxidation rate to provide an implant straggle that extends under the FinFET body a predetermined distance comprising about half of the width of the FinFET body.

15. The method of claim 10, wherein forming the material providing the enhanced oxidation rate comprises:
implanting non-dopant ions into the substrate before forming the FinFET body.

16. The method of claim 10, wherein:
forming the material providing the enhanced oxidation rate and the adjacent FinFET body comprises forming first and second epitaxial layers, respectively, the second epitaxial layer overlapping the first epitaxial layer; and
a lateral oxidation rate of the material providing the enhanced oxidation rate is faster than an oxidation rate of the material in an upward vertical direction.

17. A method of forming a Field Effect Transistor (FET), comprising:
forming a material providing an enhanced oxidation rate and an adjacent fin-shaped FET (FinFET) body protruding from a substrate; and
oxidizing the material providing the enhanced oxidation rate such that the material providing the enhanced oxidation rate oxidizes under the FinFET body faster in a direction substantially parallel to a surface of the substrate than in an upward direction substantially perpendicular to the surface of the substrate,
wherein forming the material providing the enhanced oxidation rate comprises:
implanting non-dopant ions into the substrate before forming the FinFET body.

18. The method of claim 17, further comprising:
annealing the substrate after implanting the non-dopant ions and before forming the FinFET body, wherein forming the FinFET body comprises forming an epitaxial layer on the material providing the enhanced oxidation rate.

19. A method of forming a Field Effect Transistor (FET), comprising:
forming a material providing an enhanced oxidation rate and an adjacent fin-shaped FET (FinFET) body protruding from a substrate; and
oxidizing the material providing the enhanced oxidation rate such that the material providing the enhanced oxidation rate oxidizes under the FinFET body faster in a direction substantially parallel to a surface of the substrate than in an upward direction substantially perpendicular to the surface of the substrate,
wherein:
forming the material providing the enhanced oxidation rate and the adjacent FinFET body comprises forming first and second epitaxial layers, respectively, the second epitaxial layer overlapping the first epitaxial layer; and a lateral oxidation rate of the material providing the enhanced oxidation rate is faster than an oxidation rate of the material in an upward vertical direction.

20. The method of claim 19, wherein:

the second epitaxial layer forms a channel fin of the FinFET body; and the first epitaxial layer comprises the material providing the enhanced oxidation rate.

21. The method of claim 20, wherein the first epitaxial layer provides an oxidation rate that is faster than an oxidation rate provided by the second epitaxial layer.

22. A method of forming a Field Effect Transistor (FET), comprising:

forming a region that provides increased lateral oxidation relative to oxidation of the region in an upward vertical direction under a fin-shaped FET (FinFET) body, wherein the FinFET body comprises opposite first and second sidewalls; and oxidizing the region such that the region provides the increased lateral oxidation relative to the oxidation of the region in the upward vertical direction, to provide an oxidized region that laterally extends under the FinFET body a distance that comprises at least a majority of a width of the FinFET body, wherein the width comprises a distance from the first sidewall to the opposite second sidewall of the FinFET body.

23. The method of claim 22, wherein forming the region that provides increased lateral oxidation comprises:

implanting ions into a substrate from which the FinFET body protrudes, wherein the FinFET body comprises a channel fin, and wherein oxidizing the region comprises:

oxidizing the region such that the oxidized region laterally extends under the channel fin a distance that comprises at least a majority of a width of the channel fin.

\* \* \* \* \*